United States Patent
Salam

[19]

[11] Patent Number: 6,095,666
[45] Date of Patent: Aug. 1, 2000

[54] LIGHT SOURCE

[75] Inventor: Hassan Paddy Abdel Salam, London, United Kingdom

[73] Assignee: Unisplay S.A., Geneva, Switzerland

[21] Appl. No.: 09/150,047

[22] Filed: Sep. 9, 1998

[30] Foreign Application Priority Data

Sep. 12, 1997 [GB] United Kingdom ................ 971951

[51] Int. Cl.[7] ........................................ F21V 7/00
[52] U.S. Cl. .................. 362/310; 362/297; 362/800; 362/346
[58] Field of Search .................... 362/310, 307, 362/800, 346, 297; 313/500, 512

[56] References Cited

U.S. PATENT DOCUMENTS

| | | | |
|---|---|---|---|
| 1,726,379 | 8/1929 | Benford | 362/297 |
| 4,964,025 | 10/1990 | Smith | 362/346 |
| 5,001,609 | 3/1991 | Gardner | 362/555 |
| 5,013,144 | 5/1991 | Silvergate | 362/800 |
| 5,289,082 | 2/1994 | Komoto | 313/500 |
| 5,557,115 | 9/1996 | Shakuda | 257/81 |

FOREIGN PATENT DOCUMENTS

| | | |
|---|---|---|
| 54-105285 | 7/1979 | Japan . |
| 58-46462 | 3/1983 | Japan . |
| 62-73786 | 4/1987 | Japan . |
| 2-146464 | 12/1990 | Japan . |

*Primary Examiner*—Sandra O'Shea
*Assistant Examiner*—Hargobind S. Sawhney
*Attorney, Agent, or Firm*—Dykema Gossett PLLC

[57] ABSTRACT

An LED light source for a lensed lamp is described. An LED chip sits in a hollow having a rectangular floor. A lower portion of the hollow has steep walls and accommodates the part of the chip that does not emit light. An upper part of the hollow has four side reflectors extending parallel to the sides of the chip and four corner reflectors. The hollow is formed by coining. The light source provides more uniform light than do previous arrangements having convergent lenses. The vertical viewing angle of the lamp is maintained throughout the whole of the horizontal viewing angle range of the lamp.

14 Claims, 6 Drawing Sheets

LIGHT SOURCE

FIELD AND BACKGROUND OF THE INVENTION

The present invention relates to LED lamps that use a convergent lens to intensify the light projected by the lamp. FIG. 1 illustrates a widely used arrangement for such lamps. Light from light source 2 is concentrated by lens 3 towards the viewer. FIG. 2a is a plan view of the light source of FIG. 1. Light source comprises an LED chip 4 having a light emitting front face 5. The chip is mounted on a flat internal floor 6 of light source 2. Floor 6 terminates in a conically shaped reflector 7 which reflects light from the sides of chip 4 towards lens 3. During energisation of lamp 1 current flows from terminal lead 8 through thin bonding wire 9 to bonding pad 10 of chip 4 and from the base of chip 4 out through terminal lead 11. Lead 8 and thin bonding wire 9 are not shown in FIG. 2. When current flows light source 2 appears as shown in FIG. 3, in which areas 12, 13, shown dotted, are luminous and areas 14, 15 are dark. If the light pattern of FIG. 3 is at the focus of lens 3 then a sharp version of image of FIG. 3 is projected by the lens. If the lens is arranged to be slightly closer to light source 2 than the focal length of the lens then a blurred image of the pattern of FIG. 3 is projected. Because of the defocussing, the lens projections of areas 14, 15 are rendered luminous, but of weaker luminosity than the lens projections of areas 12, 13. In this case of defocussing the light output of the lamp plotted against viewing angle Ø takes the form of solid curve 16 in FIG. 4. Ideally, the plot of lamp light intensity versus viewing angle should be as shown by dotted curve 17, i.e. with the light output constant throughout the prescribed viewing angle of the lamp.

The outer edge of the light pattern projected by the prior art lamp of FIGS. 1,2 is circular. Because of this a viewer at the limit of the prescribed horizontal viewing angular range of the lamp must be at the center of the prescribed vertical viewing angle of the lamp, otherwise lamp light will not reach him. This disadvantage arises from the construction of the light source of the lamp.

In the prior art construction of FIG. 2a dimension S is greater than 14.6% of the diagonal E of the top face of the chip. This large percentage is a major cause of the unevenness of light distribution.

Many LEDs are constructed such that only the top part of the chip emits light. FIG. 2b illustrates the effect of using such a chip in the prior art reflector of FIG. 2a. Portion 49 of chip 4 emits top light and side light. Portion 50 does not emit light. The lens associated with the light source is presented with light 70 from top face 5 and light 71 from the reflection 72R of luminous side face 72. There is a zone 74 which appears dark. Zone 74 is partly due to floor 6, as represented by spacing S in FIG. 2a, and partly due to the lens being presented with reflection 73R of dark side face 73. Dimension 74 is larger than spacing S. The positioning of luminous portion 49 above the lower end of reflector 7 enlarges the dark area around chip 4 and thus increases unevenness of light projected by the lens.

SUMMARY OF THE INVENTION

An object of the present invention is to provide a light source for a lensed LED lamp which, when the light source is spaced away from the lens by a distance slightly less than the focal length of the lens, provides a more uniform curve of light output versus viewing angle than if the prior art light source is used. Another object of the invention is to provide a lensed LED lamp arranged so the that the prescribed vertical viewing angle of the lamp is maintained for all viewing positions within the prescribed horizontal viewing angle range of the lamp.

A preferred light source according to an embodiment of the invention comprises an LED chip having a top light-emitting four-sided face, a bottom face, and four planar four-sided side faces, and a chip support member having a floor portion next to the bottom face of the chip and having four side portions, each of which corresponds to an associated one of the four side faces of the chip and rises from the floor portion. Each of the side portions includes a side reflector arranged for reflecting light from at least one of the top face and the associated side face of the chip.

A light source according to another aspect of the invention comprises an LED chip having a first portion emitting top light and side light and a second portion emitting negligible side light, and further comprises a cup having a well therein, said well accommodating said second portion; said cup including reflective portions flaring out of the top of the well arranged for reflecting light from said first portion. This aspect of the invention overcomes the problem of enlargement of dark areas around a chip that are due to reflection of dark areas at the lower portions of the side faces of the chip.

The different aspects of the invention each contribute to improving the uniformity of the light projected by the lamp, The aspects of the invention also each contribute to reducing the size of the light pattern offered to the lens; thus they also each contribute to increasing the light output of the lamp.

BRIEF DESCRIPTION OF THE DRAWINGS

FIG. 3 indicates in dotted form the pattern of light generated by the light source of FIG. 2a;

DESCRIPTION OF PREFERRED EMBODIMENTS

Figure 1:
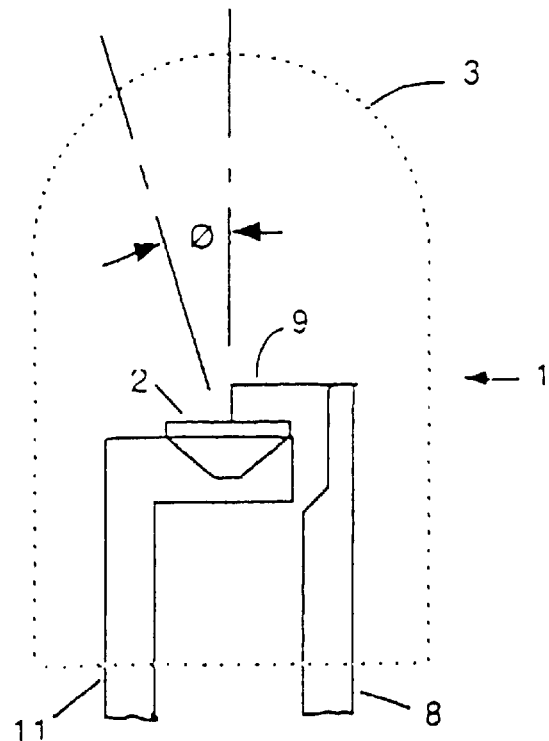
FIG. 1 is an illustration of a prior art lensed LED lamp.
Figure 5:
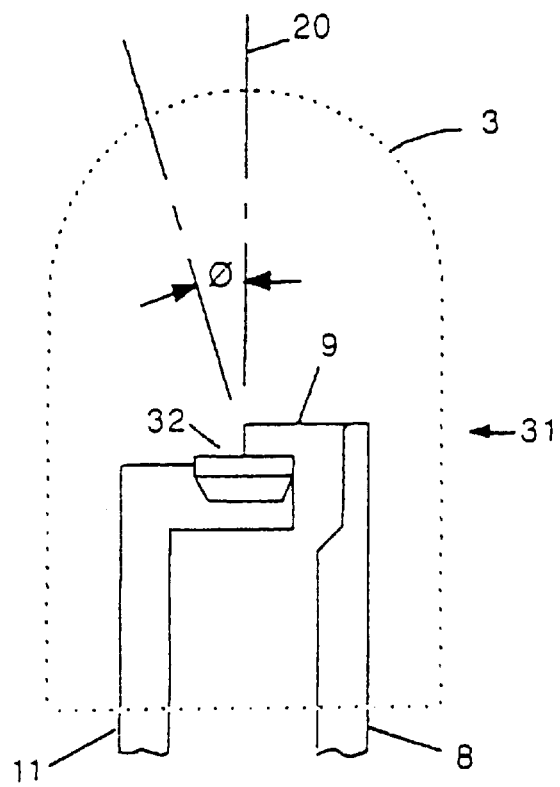
FIG. 5 illustrates a lensed LED lamp using a light source according to the present invention.
Figure 2A:
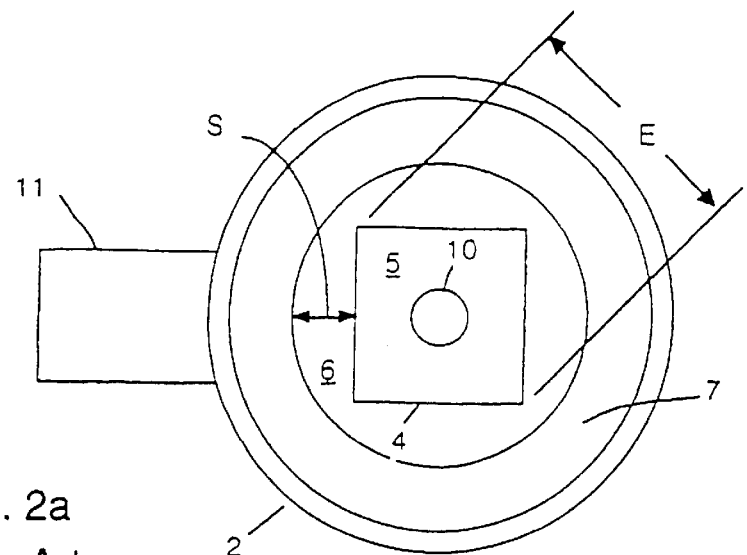
FIG. 2a is a plan view illustrating the light source of the lamp of FIG. 1.
Figure 6:
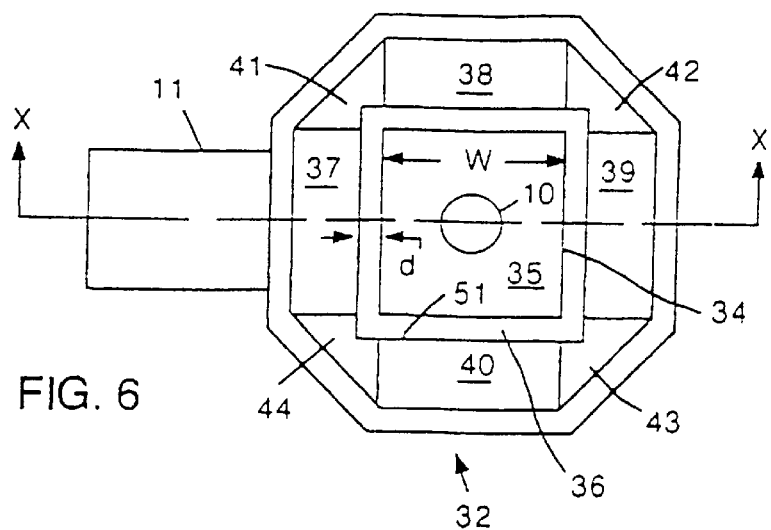
FIG. 6 is a plan view illustrating the light source of the lamp of FIG. 5.
Figure 7:
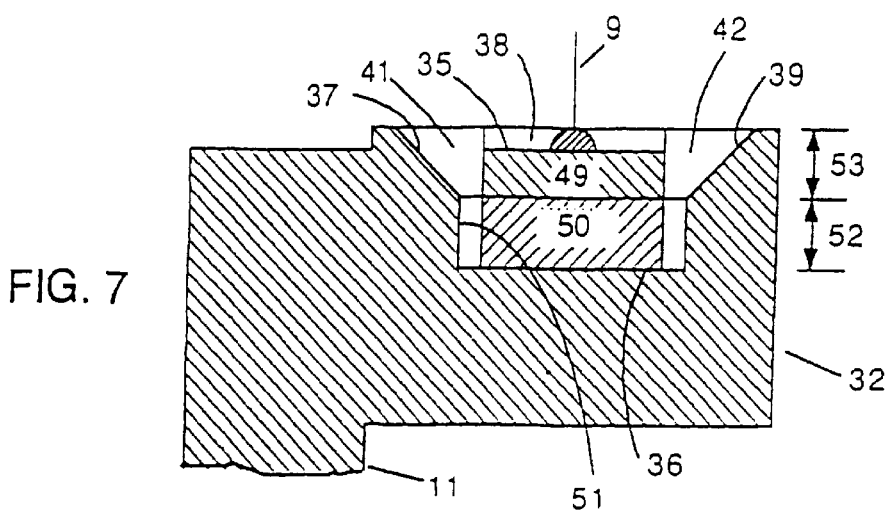
FIG. 7 is a sectional view taken along line X—X of FIG. 6, for one embodiment of the invention.

FIGS. 5, 6, 7 illustrate a lamp using a light source 32 according to an embodiment of the invention. Cylindrical lamp 31 with a body of translucent material includes a lens 3 arranged to concentrate light from light source 32 towards the viewer. Light source 32 has a hollow formed in it by coining or other means comprising a lower portion 52 and an upper portion 53. Lower portion 52 has the form of a shallow well with a rectangular floor 36 and four planar walls 51 rising from floor 36 more or less vertically. Upper portion 53 comprises four side reflectors 37–40 and four corner reflectors 41–44. The length of each side reflector is approximately equal to the length of the top edge of the chip side face associated with the reflector. For example, the length of side reflector 38 is approximately equal to W. If spacing "d" around the chip is large, the length of each side reflector may exceed the length of the top edge of the chip side face associated with the reflector. Side reflectors 37–40 flare out of the top of lower portion 52 and are inclined relative to the plane of floor 36 by about 45 degrees. Corner reflectors 41–44 flare out of the top of lower portion 52 and are inclined relative to the plane of floor 36 more steeply than are reflectors 37–40. Placed on floor 36 is an LED chip 34 having an upper portion 49 which emits light from its top face 35 and from its side faces, and a lower portion 50 which does not emit side light, or that emits only weak side light. During energisation of lamp 31, current flows from lamp terminal lead 8 through thin bonding wire 9 to bonding pad terminal 10 of chip 34 and from the base of chip 34, which serves as a second terminal for the chip, out through floor 36 and lamp terminal lead 11. The arrangement of light source 32 is such that chip portion 50 lies in lower portion 52, and light-emitting portion 49 of the chip lies in upper portion 53. Each of side reflectors 37–40 is opposite a corresponding one of the four side faces of chip 34 and lies in a plane that extends in a direction parallel to the top edge of the associated side face. Each of corner reflectors 41–44 is opposite a corresponding one of the four corners of chip 34. The eight reflectors 37–44 together reflect light from the sides and corners of chip 34 towards lens 3. Each of reflectors 37–44 may be shiny or textured (for example mat or mottled or corrugated); or shiny at parts thereof and textured at other parts thereof. Reflectors 37–44 may be coated with reflective material.

If top surface 35 of chip 24 is square, then reflectors 37–40 are identical to each other. The sideways distance "d" between each side face of chip 34 and the lower edge of its associated one of reflectors 37–40 is arranged to be less than 12%, and preferably 1–10%, of the diagonal of chip face 35. Whereas the chip may be several hundred microns wide, distance "d" can be as little as 5 microns, i.e. about 1% of the diagonal of chip face 35.

Figure 8:
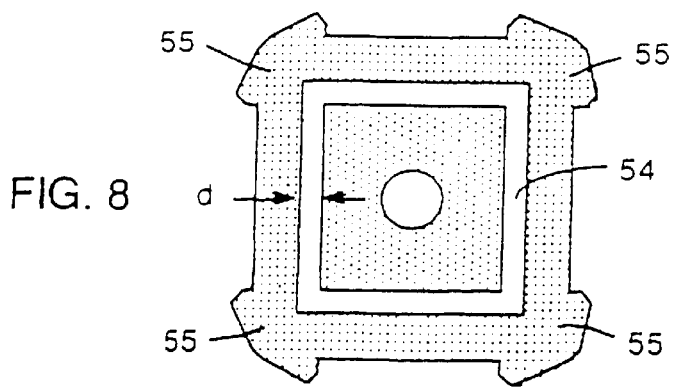
FIG. 8 Illustrates in dotted form the pattern of light generated by the light source of FIGS. 6, 7.

The appearance of light source 32 when energised and viewed in plan is shown in FIG. 8, in which the dotted areas represent light. Dark band 54 is narrow and corresponds to the previously mentioned sideways distance "d" between each side face of chip 34 and the lower edge of its associated one of reflectors 37–40. Protruding corners of light, 55, are due to the more steeply inclined reflectors 41–43 which each reflect some light from top surface 35 of chip 34, in addition to light from the chip corner.

Figure 3:
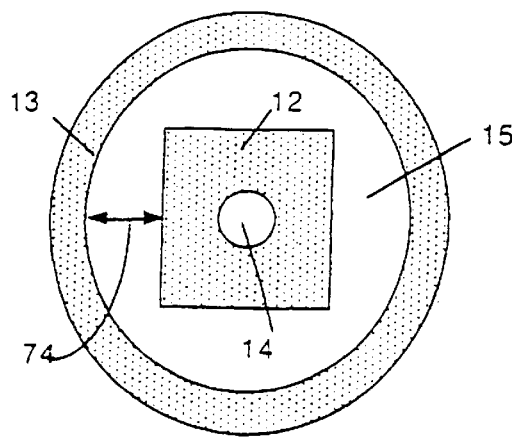
Figure 4:
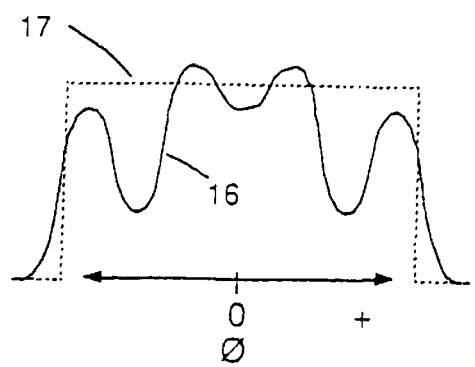
FIG. 4 is a plot of the light intensity of the lamp of FIG. 1 versus viewing angle Ø when the lens is slightly defocussed.
Figure 2B:
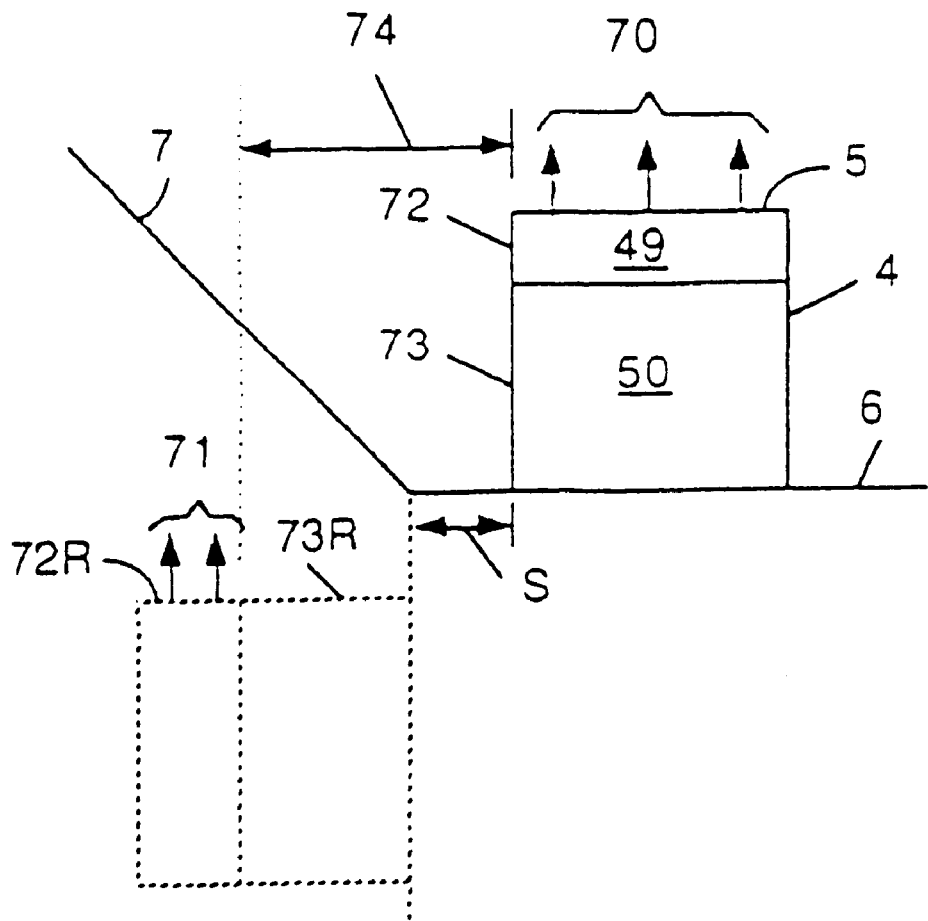
FIG. 2b illustrates properties of the light source of the lamp of FIG. 1.
Figure 9:
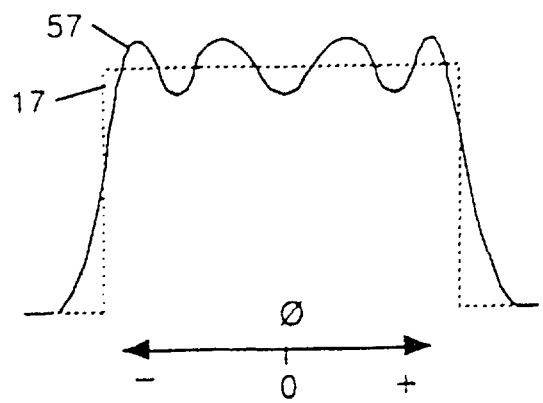
FIG. 9 is a plot of the light intensity of the lamp of FIGS. 5, 6, 7 versus viewing angle Ø when the lens is slightly defocussed.

If the light pattern of FIG. 8 is at the focus of a lens, then a sharp image of the light pattern is projected by the lens. If the lens is arranged to be slightly closer to the light pattern than the focal length of the lens then a blurred image of the pattern is projected. In this latter case the light output of the lamp plotted against viewing angle Ø can take the form of solid curve 57 in FIG. 9. Curve 57 approximates more closely to ideal plot 17 than is the case when the light pattern of FIG. 3 is offered to the lens.

Reflectors 37–40 may each be inclined to floor 36 by more than 45 degrees, so as to also reflect some light from top face 35 towards lens 3.

Figure 10:
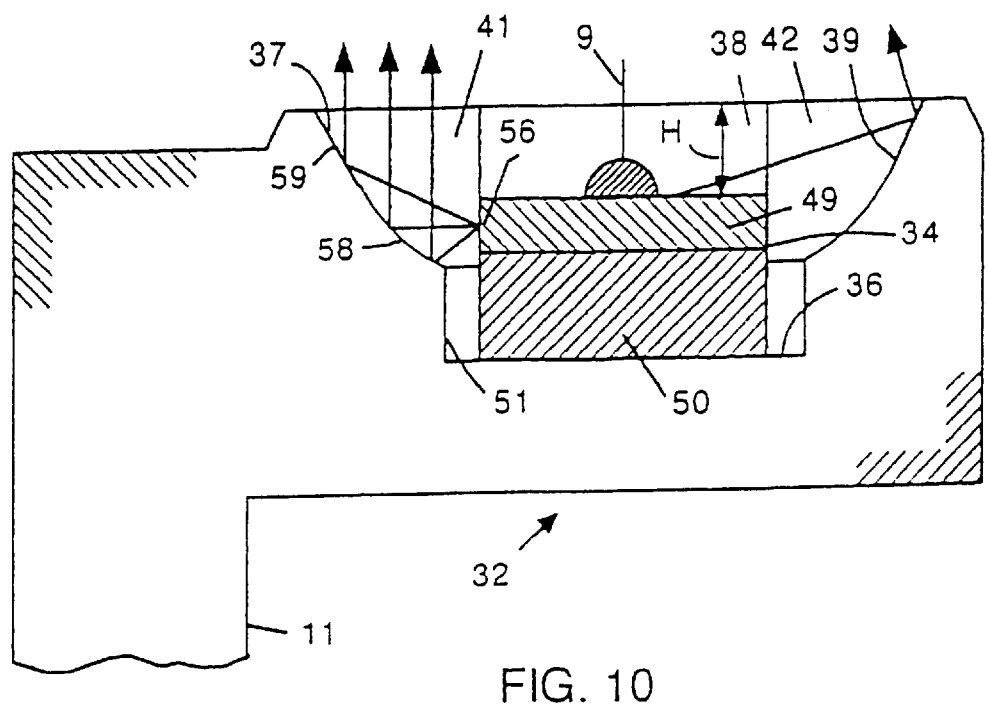
FIG. 10 is a sectional view taken along line X—X of FIG. 6 for another embodiment of the invention.

FIG. 10 illustrates an alternative arrangement of light source 32 of FIG. 6. In this embodiment the reflectors 37–40 have a profile that is partially curved, as illustrated for reflector 37. Portion 58 of the profile is parabolic, having its focus 56 situated halfway up the side of luminous chip portion 49. Each of side reflectors 37–40 extends straightly in a direction parallel to the top edge of its associated chip side face. The arrows illustrate some of the rays generated by light source 32. An advantage of the arrangement is that it directs more of the rays emanating from a chip side to a preferred orientation, namely parallel to the optical axis of the lens, which increases the brightness of the lamp. Also, it enables a more compact construction of the lamp, since the lens can be smaller. To increase the amount of chip top light reaching lens 3, the distance H between top face 35 and the the plane defining the tops of reflectors 37–40 can be made greater than the width W of the chip.

Figure 11:
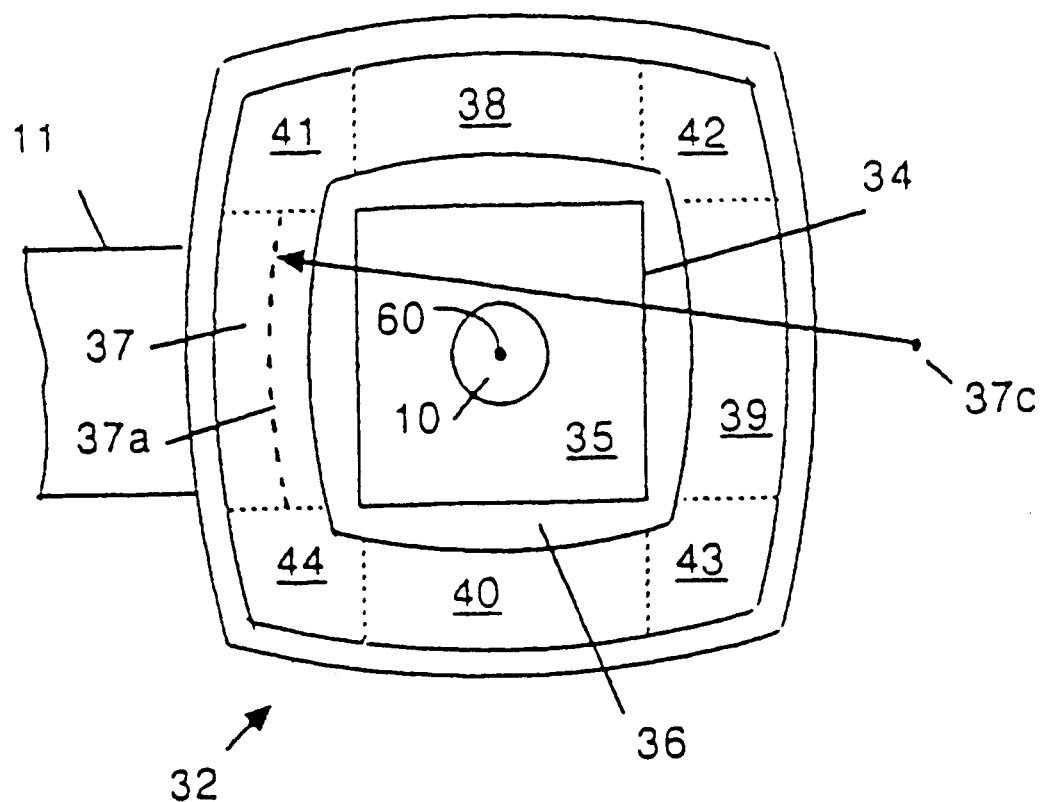
FIG. 11 is a plan view illustrating a modification to the arrangement of FIG. 6.

FIG. 11 shows another arrangement for light source 32. Side reflectors 37–40 are substantially straight. By "substantially straight" in relation to a reflector is meant that the reflector has is own individual axis of curvature, the axis being displaced from the central axis 60 of the chip. The displacement is preferably such that the axis of curvature is outside the chip. In FIG. 11, reflector 37, for example, has its own individual axis of curvature, 37c. Dotted line 37a illustrates the intersection of reflector 37 with a plane that is parallel to chip top face 35. Reverting to FIG. 6, reflector 37 therein can be regarded as having an axis of curvature that is at an infinite distance away from the center of the chip.

In the various embodiments that have been described the light emitting semiconductor chip used in light source 32 may have a substrate that is of semiconductor or of other material. The chip may have both of its terminals in the form of bonding pads on face 35. Optical axis 20 of lens 3 can pass through the center of chip face 35; or it can be offset from the center so as to direct more light downwards than upwards when lamp 31 is mounted with axis 20 horizontal.

What is claimed is:

1. A light source comprising a light emitting semiconductor chip having a top light-emitting face, a bottom face, and four planar four-sided side faces, and a chip support member having a floor with right-angled corners next to said bottom face and having four side portions, each of which corresponds to an associated one of said four side faces and rises from said floor; each of said side portions including a substantially straight side reflector arranged for reflecting the light from at least one of said top face and the associated side face; said light source including a plurality of corner reflectors each having adjacent to it an associated pair of said side reflectors and each having a surface area for reflecting light from an associated corner of said chip.

2. A light source according to claim 1 wherein said chip has an axis normal to the center of said top face and wherein at least one of said side reflectors has a center of curvature, measured in a plane that is parallel to said top face, that is on an opposite side of said chip axis from the reflector and outside said chip.

3. A light source according to claim 1 wherein the length of each side reflector is approximately equal to the length of the top edge of the chip side face associated with the reflector.

4. A light source according to claim 1 wherein the length of each side reflector is greater than the length of the top edge of the chip side face associated with the reflector.

5. An LED lamp having a light source according to claim 1 and including a lens arranged for concentrating light emanating from said light source.

6. A light source according to claim 1 including a reflector having a profile that is at least partly curved.

7. A light source according to claim 1 including a reflector having having a profile that is at least partly parabolic.

8. A light source according to claim 6 including a reflector having a parabolic profile with a focus close to its associated chip side face.

9. A light source according to claim 1 comprising a light emitting semiconductor chip having a first portion emitting top light and side light and a second portion emitting negligible side light, and comprising a cup having a well therein, said well accommodating said second chip portion; said cup having said side reflectors flaring out of the top of said well and arranged for reflecting light from said first chip portion.

10. A light source according to claim 1 arranged so that there is a spacing "d" between one of said side reflectors and the middle of its associated chip side face of less than 12% of the diagonal of said top light-emitting face.

11. A light source according to claim 1 arranged so that there is a spacing "d" between one of said side reflectors and the middle of its associated chip side face of less than 10% of the diagonal of said top light-emitting face.

12. An LED lamp including a light source comprising an LED chip having a top light-emitting four-sided face, a bottom face, and four planar four-sided side faces; and a chip support member having a floor portion next to said bottom face and having four side portions, each of which corresponds to an associated one of said four side faces and rises from said floor portion, each of said side portions including a side reflector arranged for reflecting light from at least one of said top face and said associated side face, said light source comprising a well the lower part of which has the shape of a rectangular prism and the upper part of which includes said side reflectors; said lamp including a convergent lens arranged for projecting light emanating from said light source.

13. A light source comprising an LED chip having a top light-emitting face and four side light-emitting faces mounted in a reflective cup, said cup having: a floor with right-angled corners; several substantially straight side reflectors; and a plurality of corner reflectors each abutted by an associated pair of said side reflectors and each having a surface area for reflecting light from an associated corner of said chip.

14. A light source comprising a light emitting semiconductor chip having a first portion emitting top light and side light and a second portion emitting negligible side light, and further comprising a cup having a well therein, said well accommodating said second chip portion; said cup including substantially straight reflectors flaring out of the top of said well arranged for reflecting light from said first chip portion.

* * * * *